United States Patent
Lee et al.

(10) Patent No.: US 8,319,238 B2
(45) Date of Patent: Nov. 27, 2012

(54) LIGHT EMITTING DEVICE WITH IMPROVED LIGHT EXTRACTION EFFICIENCY

(75) Inventors: Seung-Jae Lee, Cheonan-si (KR); Seong-Deok Hwang, Seoul (KR); Yu-sik Kim, Seoul (KR); Sun-Pil Youn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 192 days.

(21) Appl. No.: 12/686,501

(22) Filed: Jan. 13, 2010

(65) Prior Publication Data

US 2010/0176415 A1   Jul. 15, 2010

(30) Foreign Application Priority Data

Jan. 14, 2009   (KR) ........................ 10-2009-0003055

(51) Int. Cl.
*H01L 33/00* (2010.01)

(52) U.S. Cl. ... 257/98; 257/103; 257/618; 257/E33.003; 257/E33.013; 257/E33.069; 257/E33.074; 257/E29.003; 257/E21.347; 438/22; 438/29; 438/32; 250/492.2

(58) Field of Classification Search ..................... 257/98, 257/103, E33.001, E33.003, E33.013, E33.069, 257/E33.074, 618, E29.003, E21.347; 438/22, 438/29, 32; 250/492.2
See application file for complete search history.

(56) References Cited

U.S. PATENT DOCUMENTS

2004/0079960 A1* 4/2004 Shakuda ....................... 257/103
2009/0309191 A1* 12/2009 Theuss .......................... 257/618

FOREIGN PATENT DOCUMENTS

| JP | 2004-128445 | 4/2004 |
| JP | 2007-088276 | 4/2007 |
| KR | 1020070036118 A | 4/2007 |

* cited by examiner

*Primary Examiner* — Meiya Li
(74) *Attorney, Agent, or Firm* — Volentine & Whitt, PLLC

(57) ABSTRACT

A light emitting device having a high degree of light extraction efficiency includes a substrate, and a light emitting structure disposed on one surface of the substrate, the substrate having an internal reformed region where the index of refraction differs from the remainder the substrate. The ratio of the depth of the reformed region (distance between the other surface of the substrate and the reformed region) to the thickness of the substrate is in a range of between 1/8 and 9/11.

9 Claims, 18 Drawing Sheets

LIGHT EMITTING DEVICE WITH IMPROVED LIGHT EXTRACTION EFFICIENCY

CROSS-REFERENCE TO RELATED APPLICATION

This application claims priority from Korean Patent Application No. 10-2009-0003055 filed on Jan. 14, 2009 in the Korean Intellectual Property Office, and all the benefits accruing therefrom under 35 U.S.C. 119.

BACKGROUND

The present inventive concept relates to a light emitting device. More particularly, the inventive concept relates to a light emitting device having a light emitting structure, such as an LED, and a substrate to which the light emitting structure is attached and through which light produced by light emitting structure is transmitted.

Light emitting devices such as those employing light emitting diodes (LEDs) emit light when electrons and holes are combined. The light emitting devices have several advantages including low power consumption, extended life span, being installable without spatial limitation, and robustness against vibration.

One of the most challenging issues with respect to developing light emitting devices is to improve their light extraction efficiency. Light extraction efficiency is defined as a ratio of light escaping into the ambient (i.e., air or transparent resin covering a light emitting device) to light generated within the light emitting device. A gallium nitride (GaN) substrate has an optical refractive index of about 2.5 which is greater than that of air or a transparent resin. When light generated within the GaN substrate is incident upon an interface between two media at an angle greater than a critical angle, the incident light undergoes total internal reflection (TIR) and is trapped in the GaN substrate and cannot escape into the air or transparent resin. This may detract from the light extraction efficiency of the device.

SUMMARY

According to one aspect of the inventive concept, there is provided a light emitting device comprising a substrate having a reformed region intermediate the major (oppositely facing) surfaces thereof, and a light emitting structure disposed on one of the surfaces. The light emitting structure comprises a light source of the light emitting device. Furthermore, the index of refraction of the reformed region of the substrate is different from that of the remainder of the substrate, and the ratio d/t of the distance d between the other surface of the substrate and the reformed region (the depth of the reformed region from the other surface) to the thickness t of the substrate (the distance between the surfaces of the substrate) is in a range of between 1/8 and 9/11.

According to another aspect of the present invention, there is provided a light emitting device comprising a substrate having an internal layer of dots of polycrystalline, and a light emitting structure disposed on one of the surfaces of the substrate. The remainder of the substrate is mono-crystalline. Furthermore, the distance between the other surface of the substrate and the layer of polycrystalline dots is in a range of 10 to 90 μm, and the dots of polycrystalline are spaced from one another in the layer, i.e., in a direction perpendicular to the direction of thickness of the substrate, by a distance of 2 to 12 μm.

BRIEF DESCRIPTION OF THE DRAWINGS

The inventive concept will become more apparent from the following detailed description of preferred embodiments thereof made with reference to the attached drawings in which.

DETAILED DESCRIPTION OF THE PREFERRED EMBODIMENTS

The preferred embodiments of the inventive concept will now be described in detail with reference to the accompanying drawings. Note, like reference numbers are used to designate like elements throughout the drawings.

A first embodiment of a light emitting component or device 1 according to the inventive concept will now be described with reference to FIGS. 1 and 2.

Figure 1:
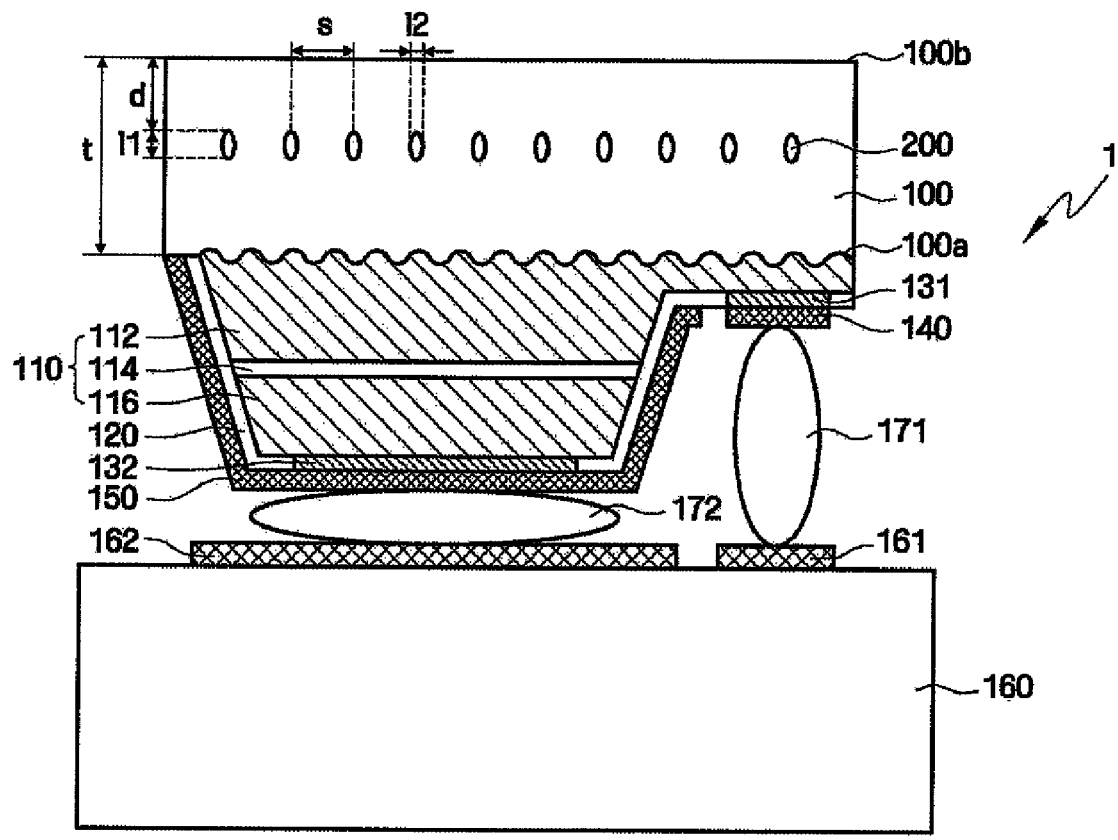
FIG. 1 is a cross-sectional view of a first embodiment of a light emitting device according to the inventive concept.

Referring to FIG. 1, the light emitting device 1 includes a generally planar substrate 100, a light emitting structure 110 disposed on a surface 100*a* of the substrate 100, and first and second electrodes 140 and 150. The substrate 100 may be an insulating substrate formed of sapphire ($Al_2O_3$) or zinc oxide (ZnO) or a conductive substrate formed of silicon (Si), silicon carbide (SiC), or gallium nitride (GaN). The substrate 100 may also be a mono-crystalline substrate. Also, the thickness t of the substrate 100, that is, the distance between the opposite surfaces 100a and 100b thereof, may be in a range of between 80 μm and 110 μm.

The surface 100a of the substrate 100 on which the light emitting structure 110 is disposed has a pattern of protuberances that provide the surface 100a with a predetermined roughness, i.e., the surface 100a is embossed. The other surface 100b of the substrate 100 is exposed to the air. Overall, the light emitting device 1 has a flip-chip type of bonding structure (described in more detail later on) such that the light generated by the light emitting structure 110 exits the device via the surface 100b.

The light emitting structure 110 includes a first conductive pattern 112, a light emitting pattern 114 and a second conductive pattern 116 disposed in the foregoing sequence one atop the other on (the surface 100a of) the substrate 100. The first and second conductive patterns 112 and 116 are electrically connected to the first and second electrodes 140 and 150, respectively. Each of the first and second electrodes 140 and 150 may be of material selected from the group consisting of indium tin oxide (ITO), copper (Cu), nickel (Ni), chrome (Cr), gold (Au), titanium (Ti), platinum (Pt), aluminum (Al), vanadium (V), tungsten (W), molybdenum (Mo), and silver (Ag).

The first conductive pattern 112, the light emitting pattern 114, and the second conductive pattern 116 may each comprise material represented by the formula $In_xAl_yGa_{(1-x-y)}N$ ($0 \leq x \leq 1$, $0 \leq y \leq 1$). Thus, the first conductive pattern 112, the light emitting pattern 114 or the second conductive pattern 116 may be a layer of GaN. In an example of the embodiment of FIG. 1, the first conductive pattern 112, the light emitting pattern 114, and the second conductive pattern 116 are each a layer of either AlGaN or InGaN.

The first conductive pattern 112 is of one conductivity type (e.g., n-type or p-type) and the second conductive pattern 116 is of the other (opposite) conductivity type (e.g., p-type or n-type). The conductivity types of the first and second conductive patterns 112 and 116 depend on the design rule of the device.

The light emitting pattern 114 is configured to generate light when carriers (e.g., electrons) from the first conductive pattern 112 and carriers (e.g., holes) from the second conductive pattern 116 are combined. Although not shown in FIG. 1, the light emitting pattern 114 includes a well layer and a barrier layer. The well layer has a smaller bandgap than the barrier layer. Therefore, electron and hole carriers are collected at the well layer and combine. The light emitting pattern 114 may have either a single quantum well (SQW) or multiple quantum well (MQW) structure. A SQW structure has a single well layer whereas an MQW structure includes a plurality of well layers. Either the well layer or the barrier layer may be doped with at least one of boron (B), phosphorous (P), silicon (Si), magnesium (Mg), zinc (Zn), selenium (Se), and aluminum (Al) to establish the desired light emission characteristics.

The light emitting structure 110 has a top surface and sides that extend obliquely relative to the top surface. In this respect, the light emitting structure 110 tapers away from the substrate 100 such that the width of the first conductive pattern 112 is greater than widths of the second conductive pattern 116 and light emitting pattern 114. The second electrode 150 extends over the top surface and the sides of the light emitting structure 110. Therefore, light generated in the light emitting pattern 114 is reflected by the second electrode 150 and escapes without being trapped within the light emitting structure 110. Thus, the light extraction efficiency of the light emitting device 1 is relatively high.

The light emitting device 1 also has an insulating layer 120, and first and second ohmic layers 131 and 132 disposed on the light emitting structure 110. The insulating layer 120 conforms to the profile of the light emitting structure 110. The insulating layer 120 may comprise a layer of silicon oxide, silicon nitride, aluminum oxide, or aluminum nitride. Each of the first and second ohmic layers 131 and 132 may be of material selected from the group consisting of indium tin oxide (ITO), zinc (Zn), zinc oxide (ZnO), silver (Ag), tin (Sn), aluminum (Al), gold (Au), nickel (Ni), indium oxide ($In_2O_3$), tin oxide ($SnO_2$), copper (Cu), tungsten (W), and platinum (Pt).

Furthermore, the insulating layer 120 exposes portions of the first and second conductive patterns 112 and 116, respectively. The first ohmic layer 131 is disposed on the portion of the first conductive pattern 112 exposed by the insulating layer 120, and the first electrode 140 is disposed on the first ohmic layer 131. On the other hand, the second ohmic layer 132 is disposed on the portion of the second conductive pattern 116 exposed by the insulating layer 120, and the second electrode 150 is disposed on the second ohmic layer 132 as well as on the insulating layer 120.

More specifically, a portion of the first conductive pattern 112 protrudes laterally of the second conductive pattern 116 and hence, is not juxtaposed with any part of the first conductive pattern 112. The first electrode 140 and first ohmic layer 131 are disposed on the protruding portion of the first conductive pattern 112. The second electrode 150 and the second ohmic layer 132 are disposed on the top surface of the light emitting structure 110, and the second electrode 150 also extends along the insulating layer 120 over the oblique sidewalls of the light emitting structure 110.

Figure 2:
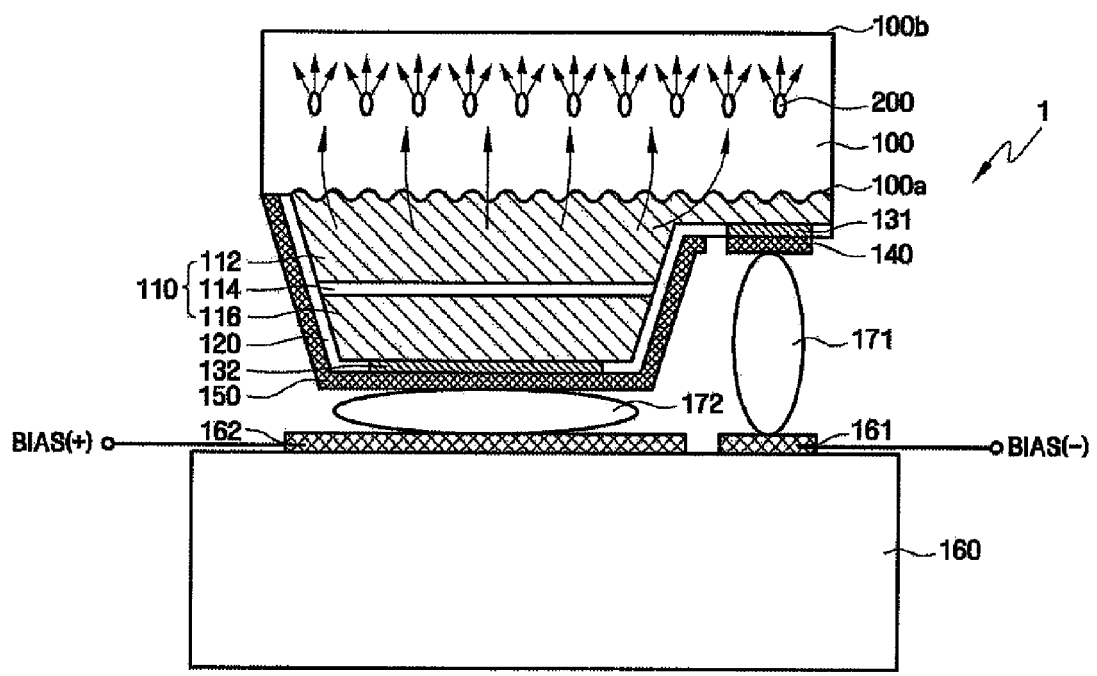
FIG. 2 is a view similar to that of FIG. 1 and illustrates the operation of the light emitting device.

Although not shown in FIGS. 1 and 2, a buffer layer may be interposed between the substrate 100 and the first conductive pattern 112. The buffer layer can be used as a seed layer for forming the first conductive pattern 112, the light emitting pattern 114, and the second conductive pattern 116. To this end, the buffer layer may be of material represented by the formula $In_xAl_yGa_{(1-x-y)}N$ ($0 \leq x \leq 1$, $0 \leq y \leq 1$) or $Si_xC_yN_{(1-x-y)}$ ($0 \leq x \leq 1$, $0 \leq y \leq 1$). The buffer layer can also be used to prevent a lattice mismatch between the substrate 100 and the light emitting structure 110, thereby improving the film characteristics of the light emitting structure 110.

The first embodiment of the light emitting device 1 according to the inventive concept may further include a support. The support may be, for example, a sub-mount, circuit board, or package. The support has a support substrate 160 and first and second conductive regions 161 and 162 extending along one surface of the support substrate 160 as electrically isolated from each other.

The first and second electrodes 140 and 150 oppose and are bonded to the support, i.e., such that the device 1 has a flip-chip type of mounting structure. More specifically, the first electrode 140 is connected to the first conductive region 161 on the support substrate 160 through electrically conductive solder 171. Similarly, the second electrode 150 is connected to the second conductive region 162 on the support substrate 160 through conductive solder 172. As an alternative, the second electrode 150 can be disposed directly against the second conductive region 162 so as to be electrically conductively connected to the region 162, i.e., without the use of the conductive solder 172.

Referring now back to the substrate 100, the substrate 100 has a reformed region 200 located intermediate the two major surfaces 100a and 100b thereof.

The reformed region 200 may be constituted by discrete bodies of material having an optical refractive index greater than or equal to that of the ambient medium, such as air, and less than that of the remainder of the substrate 100. Thus, light produced by the light emitting structure 110 is transmitted to the ambient medium (e.g. the air) through the reformed region 200. The reformed region 200 scatters the light so that the light is not trapped within the substrate 100 due to total internal reflection (TIR). Therefore, light extraction efficiency of the light emitting device 1 is maximized.

The ratio of the depth d from the surface 100b of the substrate 100 to the reformed region 200 to the thickness t of the substrate 100 is in a range of between 1/8 and 9/11. If the ratio is less than 1/8, the reformed region only has a slight affect on the light extraction efficiency. If the ratio is greater than 9/11, the light emitting structure 110 may be damaged when the reformed region 200 is formed. With this in mind, in the example of the embodiment of FIG. 1 in which the substrate has a thickness of between 80 and 110 μm, the depth d is thus in a range of between 10 and 90 μm.

Furthermore, in the case in which the substrate 100 is a mono-crystalline substrate, the reformed region 200 may be a region of polycrystalline dots in the mono-crystalline substrate 100. Such a reformed region 200 of dots of polycrystalline may be produced by irradiating the substrate 100 with a permeable pulse laser. The bandwidth of the laser light selected for forming the reformed region 200 is such that the light cannot be absorbed by the surface 100b of the substrate 100 and is transmitted into the substrate 100. As a result, an internal mono-crystalline layer of the substrate 100 is transformed into polycrystalline (polycrystalline dots). In this respect, the bandwidth of the laser light used depends on the material and thickness of the substrate 100. For example, in the case in which the substrate 100 is a sapphire or SiC substrate, laser light having a wavelength greater than 1,000 nm (e.g., 1.064 nm) is used to form the reformed region 200. In this case, the dots of polycrystalline are substantially ellipsoid and the max diameter or major axis 11 of the polycrystalline dots is in a range of 2 to 20 μm. This dimension also corresponds to the thickness of the reformed region 200 because a single layer of the polycrystalline dots is formed using the above-described technique. Also, the polycrystalline dots are spaced from one another, in a direction perpendicular to the direction of thickness of the substrate, i.e., in the direction of the plane of the substrate, by equal intervals (equal distances s) of 2 to 12 μm.

Table 1 below shows the light extraction efficiency of light emitting devices embodied as described above with reference to FIG. 1, and the light extraction efficiency of corresponding light emitting devices without reformed regions in their substrates. The light emitting devices had 600 μm×200 μm substrates of sapphire and GaN. In the light emitting devices according to the inventive concept, the refractive index of the reformed region 200 (polycrystalline dots) was 1, the thickness 12 of the reformed region 200 (major diameter of the polycrystalline dots) was 4 μm, and the spacing between the discrete parts (polycrystalline dots) of the reformed region 200 was 4 μm.

TABLE 1

|  | Sapphire substrate | GaN substrate |
|---|---|---|
| Light extraction efficiency of device without a reformed region | 21.14% | 18.22% |
| Light extraction efficiency of device having a reformed region | 25.47% | 33.91% |

As is evident from Table 1, the light extraction efficiency is greater in the devices having a reformed region 200 according to the inventive concept, irrespective of the type of substrate.

Table 2 shows the light extraction efficiency of light emitting devices embodied as described above, according to the inventive concept, and which differed from one another only with respect to the distance s between the discrete parts (polycrystalline dots) of their reformed regions.

TABLE 2

| Distance (s) in μm | Light extraction efficiency |
|---|---|
| 2 | 30.21% |
| 4 | 28.51% |
| 8 | 25.25% |
| 12 | 22.42% |

As is demonstrated by Table 2, the light extraction efficiency decreases as the distance s between the discrete parts of the reformed region 200 (polycrystalline dots) increases. Once the distance s exceeds 12 μm, the light extraction efficiency only increased slightly. If the distance s is less than 2 μm, the substrate 100 was broken due to cracks induced by the laser light.

Table 3 shows the light extraction efficiency of light emitting devices embodied as described above, according to the inventive concept, and which differed from each other only with respect to the depth d at which the reformed region 200 (polycrystalline dots) is located as measured from the surface 100b of the substrate 100.

TABLE 3

| Depth (d) in μm | Light extraction efficiency |
|---|---|
| 10 | 24.53% |
| 30 | 25.47% |
| 50 | 26.01% |
| 70 | 26.54% |

Table 3 above demonstrates that the light extraction efficiency increases as the depth d increases. That is, the light extraction efficiency increases the closer the reformed region 200 (polycrystalline dots) is to the light emitting structure 110.

Referring to FIG. 2, when the first and second conductive patterns 112 and 116 have n- and p-type conductivities, respectively, a negative bias BIAS(−) is applied to the first conductive pattern 112 through the first conductive region 161, the conductive solder 171, the first electrode 140, and the first ohmic layer 131. A positive bias BIAS(+) is applied to the second conductive pattern 116 through the second conductive region 162, the conductive solder 172, the second electrode 150, and the second ohmic layer 132. Conversely, if the first and second conductive patterns 112 and 116 have p- and n-type conductivities, respectively, a positive bias BIAS(+) is applied to the first conductive pattern 112 through the first conductive region 161, the conductive solder 171, and the first electrode 140, and the first ohmic layer 131. On the other hand, a negative bias BIAS(−) is applied to the second conductive pattern 116 through the second conductive region 162, the conductive solder 172, the second electrode 150, and the second ohmic layer 132.

When the biases are applied in this way, for example as shown in FIG. 2, a forward bias is applied to the light emitting structure 110. When forward-biased, the light emitting pattern 114 emits light. The light is scattered by the reformed region 200; accordingly a substantial amount of the light is transmitted by the light emitting device 1 through (the surface 100b of) the substrate 100.

Figure 3A:
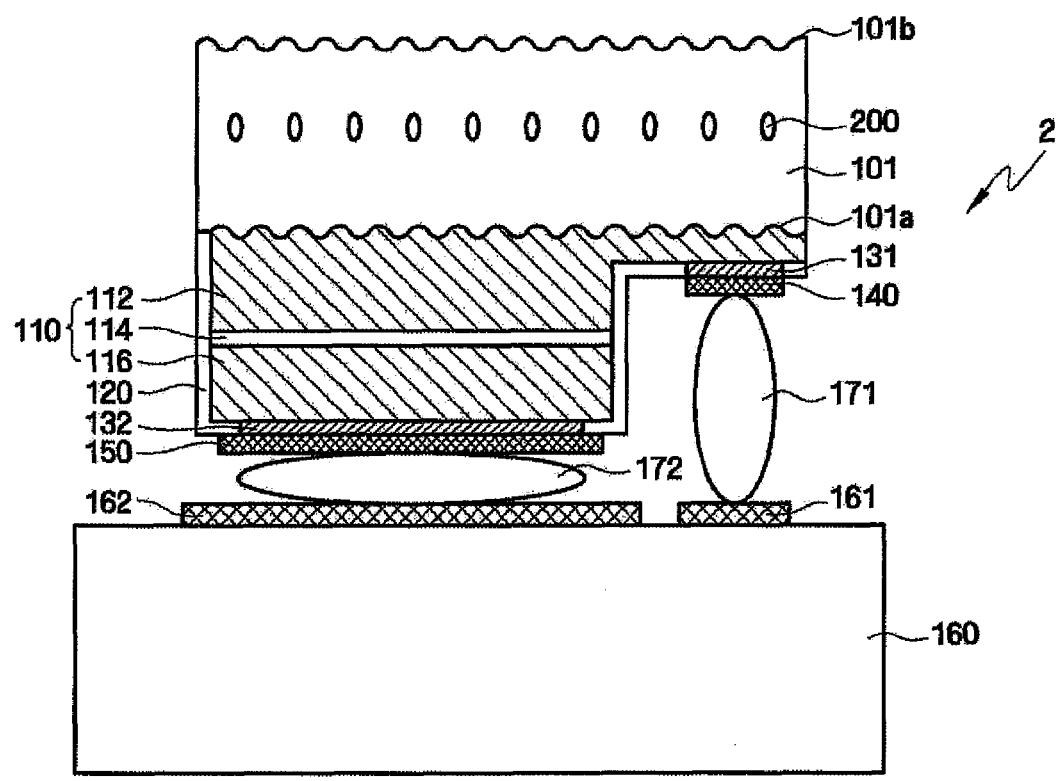
FIG. 3A is a cross-sectional view of a second embodiment of a light emitting device according to the inventive concept.
Figure 3B:
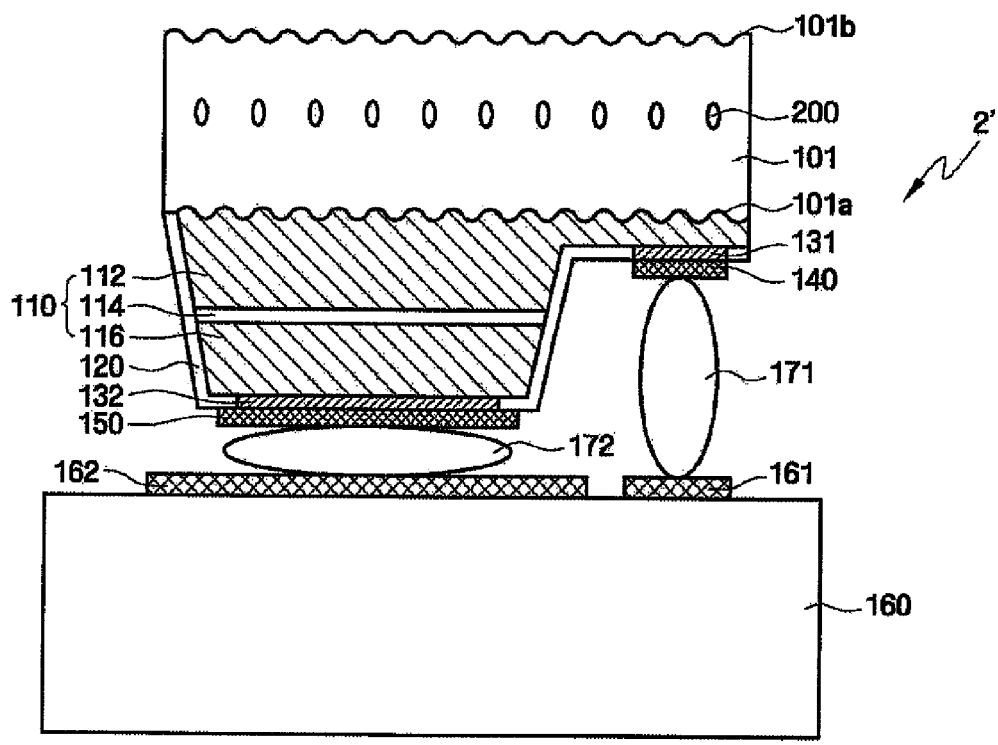
FIG. 3B is a cross-sectional view of another form of the second embodiment of the light emitting device according to the inventive concept.

FIGS. 3A and 3B respectively show different forms of a second embodiment of a light emitting device 2 or 2', according to the inventive concept.

The substrate 101 of the light emitting device 2 or 2' has a pattern of protruberances at each of the major surface 101a and 101b thereof. That is, both surfaces 101a and 101b are embossed. Therefore, the angle at which light generated by the light emitting structure 110 is incident on the surface 100b is minimized, thereby further reducing the possibility that light will be trapped within the substrate 101 due to TIR.

Furthermore, in the second embodiment of the light emitting device 2 or 2', the second electrode 150 is disposed on the top surface only of the light emitting structure 110. Also, in the light emitting device 2 shown in FIG. 3A, the light emitting structure 110 has parallel sides extending perpendicularly to the top surface. On the other hand, in the light emitting device 2' shown in FIG. 3B, the light emitting structure 110 has oblique sides similarly to the embodiment of FIG. 1.

Figure 4A:
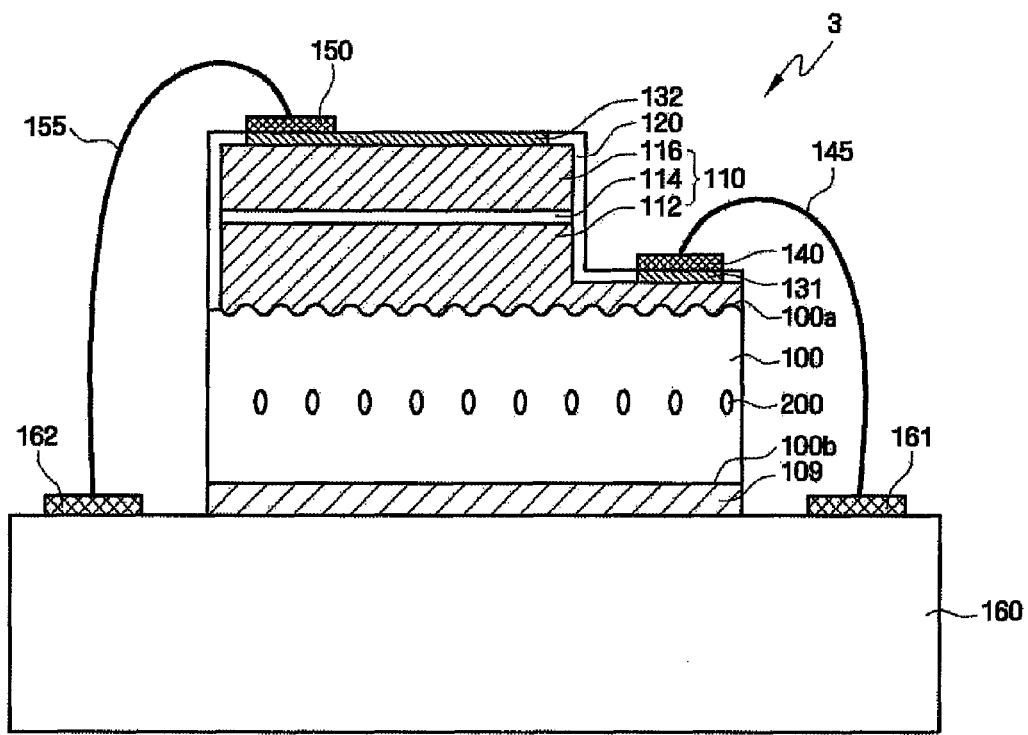
FIG. 4A is a cross-sectional view of a third embodiment of a light emitting device according to the inventive concept.
Figure 4B:
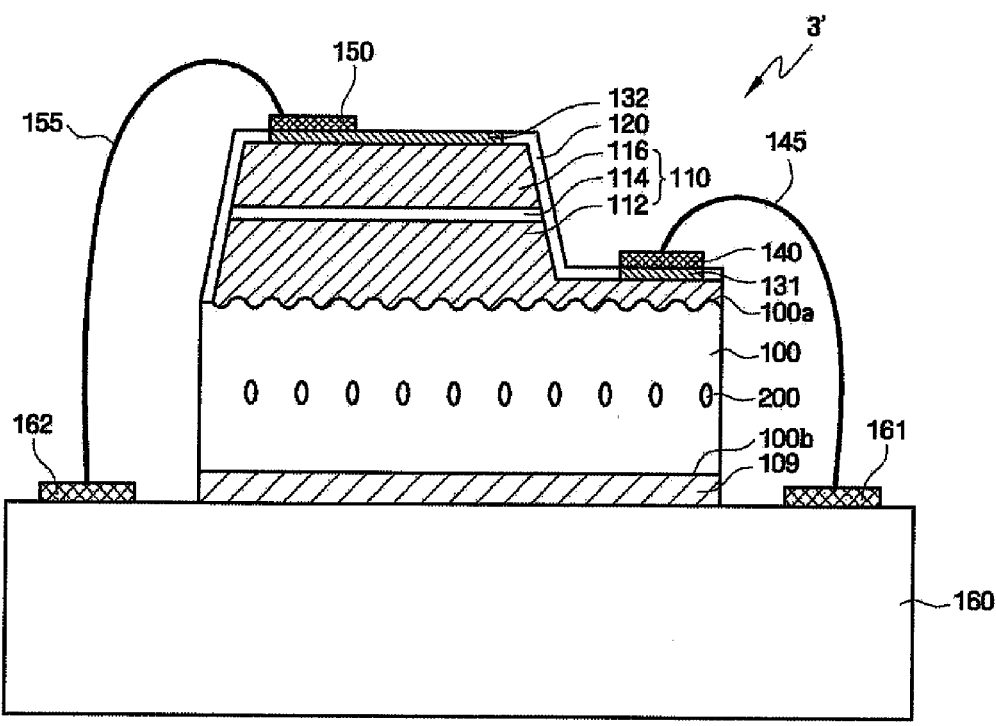
FIG. 4B is a cross-sectional view of another form of the third embodiment of the light emitting device according to the inventive concept.

FIGS. 4A and 4B respectively show different forms of a third embodiment of a light emitting device 3 or 3', according to the inventive concept. As shown in FIG. 4A, the light emitting structure 110 of the third embodiment of the light emitting device may have parallel sides. Alternatively, as shown in FIG. 4B, the light emitting structure 110 may have oblique sides.

In either case, the light emitting device 3 or 3', according to the inventive concept, has a lateral-chip type of bonding structure. That is, the substrate 100 of the light emitting device 3 or 3 faces the support substrate 160. Furthermore, a reflective metal layer 109 is disposed on the surface 100b of the substrate 100 so as to be interposed between the substrate 100 and the support substrate 160. The first electrode 140 is connected by a wire 145 to the first conductive region 161 on the support substrate 160. Similarly, the second electrode 150 is connected by a wire 155 to the second conductive region 162 on the support substrate 160.

Figure 5:
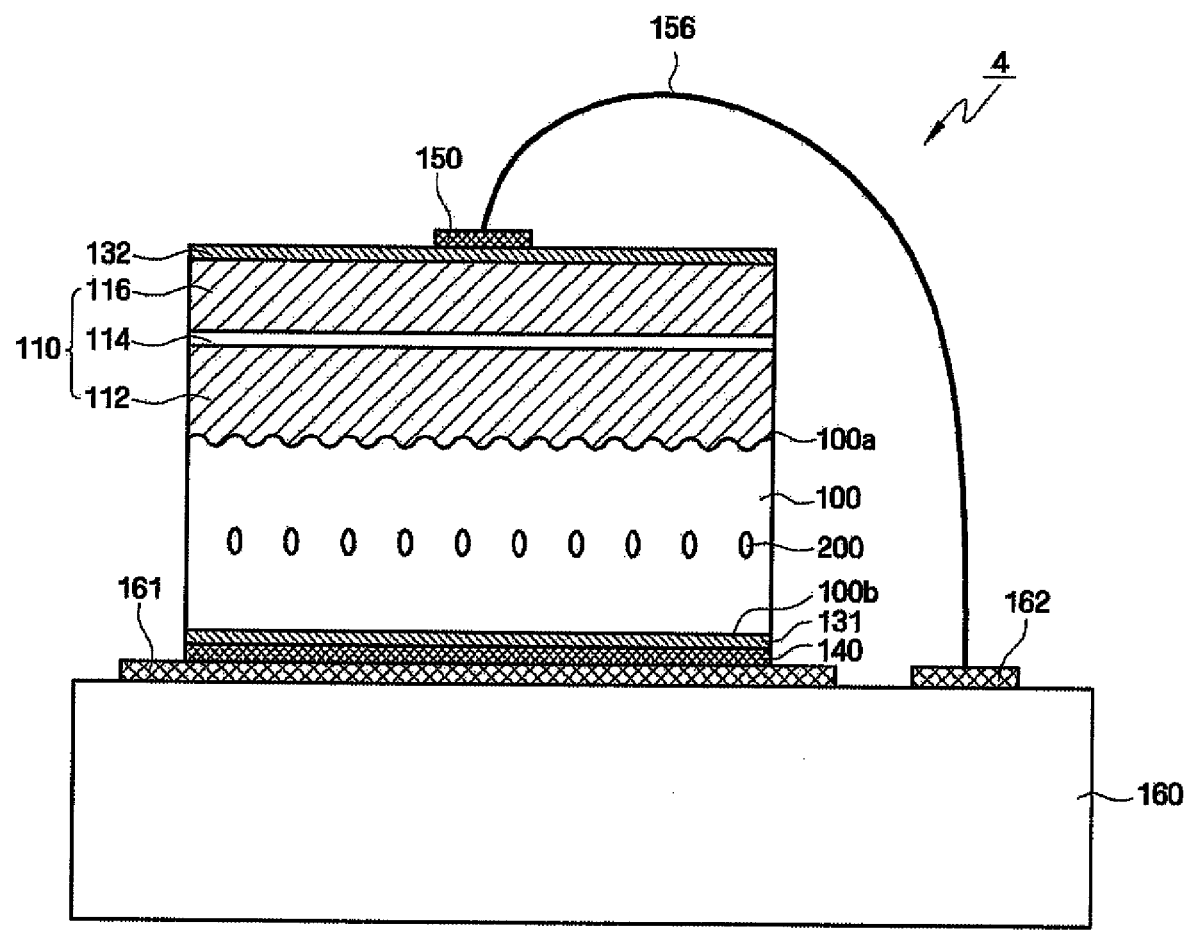
FIG. 5 is a cross-sectional view of a fourth embodiment of a light emitting device according to the inventive concept.

FIG. 5 shows a fourth embodiment of a light emitting device 4 according to the inventive concept. The light emitting device 4 has a vertical chip type of bonding structure.

More specifically, the substrate 100 is a conductive substrate and the first electrode 140 is directly attached and thereby electrically connected to the first conductive region 161 on the substrate support 160. The second electrode 150 is electrically connected by a wire 156 to the second conductive region 162 on the substrate support 160.

Furthermore, the first electrode 140 is made of a reflective metal and reflects light emitted from the light emitting structure 110 upward toward the substrate 100. In this respect and for the reasons explained above, only one surface 100a of the substrate 100 may have a pattern of protruberances as shown in FIG. 5, or each of surfaces 100a and 100b may have a pattern of protruberances.

Figure 6:
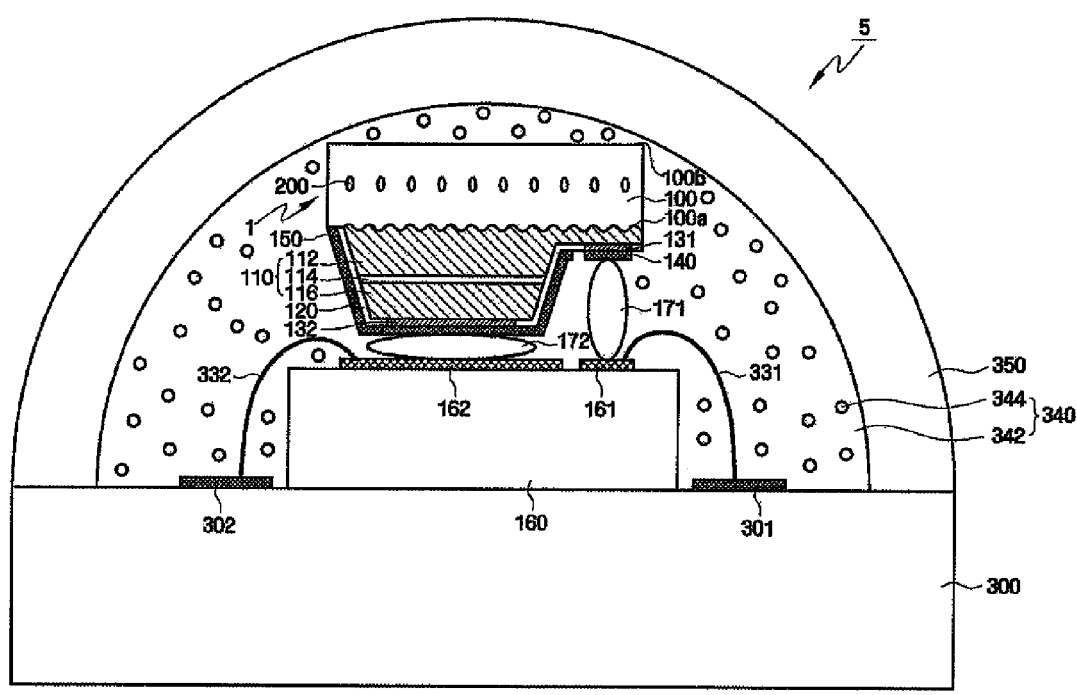
FIG. 6 is a cross-sectional view of a fifth embodiment of a light emitting device according to the inventive concept.

FIG. 6 shows a fifth embodiment of a light emitting device 5 according to the inventive concept.

Referring to FIG. 6, the light emitting device 5 includes a circuit board 300 and a light emitting component, corresponding to the embodiment of the light emitting device 1 shown in and described with reference to FIGS. 1 and 2, mounted to the circuit board 300. The light emitting device 5 further includes a phosphor layer 340 surrounding the light emitting component 1 and a transparent resin cover 350 enclosing the phosphor layer 340.

The circuit board 300 includes a substrate and electrically-isolated first and second conductive regions 301 and 302 on one surface thereof. The first conductive region 161 of the support of the light emitting component 1 is connected by a wire 331 to the first conductive region 301 of the circuit board 300. Thus, the first electrode 140 of the light emitting component 1 is connected to the first conductive region 301 of the circuit board 300 via the conductive solder 171, the first conductive region 161 on the support substrate 160 and the wire 331. The second conductive region 162 of the support of the light emitting component 1 is connected by a wire 332 to the second conductive region 302 of the circuit board 300. Thus, the second electrode 150 of the light emitting component 1 is coupled to the second conductive region 302 of the circuit board 300 via the conductive solder 172, the second conductive region 162 on the support substrate 160 and the wire 332.

The phosphor layer 340 is a mixture of a first transparent resin 342 and phosphors 344. Note, in the embodiment of FIG. 6, the phosphor layer 340 may be confined to a region above the wires 331 and 332 so that the wires 331 and 332 are protected. Also, the term "phosphors" as used herein refers to particles of one or more types of phosphor.

The phosphors 344 dispersed in the phosphor layer 340 absorb light emitted from the light emitting device 5 and transform it into light of a different wavelength. Thus, the higher the uniformity of the phosphors, the better the light emission characteristics. In this case, the phosphors 344 serve to effect wavelength conversion and color mixing. For example, the phosphor layer 340 may be composed to produce white light. If the light emitting device 5 is to emit blue light, the phosphor layer 340 may include phosphors that yield yellow light and phosphors that yield red light in order to enhance the Color Rendering Index (CRI). If the light emitting device 5 is to emit ultraviolet (UV) light, the phosphor layer 340 may include phosphors that yield red, green, and blue (RGB) light, respectively.

The phosphors 344 may be selected from the group consisting of a nitride-based/oxynitride-based phosphor, mainly activated by lanthanoids such as Eu and Ce; an alkaline earth halogen apatite phosphor, an alkaline earth metal borate halogen phosphor, an alkaline earth metal aluminate phosphor, an alkaline earth silicate phosphor, an alkaline earth sulfide phosphor, an alkaline earth thiogallate phosphor, a thiosilicate phosphor, an alkaline earth silicon nitride phosphor, a germinate phosphor, and a rare earth aluminate phosphor, mainly activated by lanthanoids such as Ce; and a rare earth silicate phosphor, an organic material or organic complex, mainly activated by lanthanoids such as Ce.

Examples of the nitride-based phosphor that is mainly activated by lanthanoid elements such as Eu and Ce include $M_2Si_5N_8$:Eu (wherein M represents at least one element selected from the group consisting of Sr, Ca, Ba, Mg and Zn). In addition to $M_2Si_6N_8$:Eu, the examples also include $MSi_7N_{10}$ Eu, $M_{1.8}Si_5O_{0.2}N_8$:Eu, and $M_{0.9}Si_7O_{0.1}N_{10}$Eu (wherein M represents at least one element selected from the group consisting of Sr, Ca, Ba, Mg and Zn).

Examples of the oxynitride phosphor that is mainly activated by lanthanoid elements such as Eu and Ce include $MSi_2O_2N_2$:Eu (wherein M represents at least one element selected from the group consisting of Sr, Ca, Ba, Mg and Zn).

Examples of the alkaline earth halogen apatite phosphor that is mainly activated by lanthanoid elements such as Eu, or by transition metal elements such as Mn include $M_5(PO_4)_3X:R$ (wherein M represents at least one element selected from the group consisting of Sr, Ca, Ba, Mg and Zn; X represents at least one element selected from the group consisting of F, Cl, Br, and I; and R represents either Eu or Mn).

Examples of the alkaline earth metal borate halogen phosphor include $M_2B_5O_9X:R$ (wherein M represents at least one element selected from the group consisting of Sr, Ca, Ba, Mg and Zn; X represents at least one element selected from the group consisting of F, Cl, Br, and I; and R represents either Eu or Mn).

Examples of the alkaline earth metal aluminate phosphor include $SrAl_2O_4:R$, $Sr_4Al_{14}O_{25}:R$, $CaAl_2O_4:R$, $BaMg_2Al_{16}O_{27}:R$, $BaMg_2Al_{16}O_{12}:R$, and $BaMgAl_{10}O_{17}:R$ (wherein R represents either Eu or Mn).

Examples of the alkaline earth sulfide phosphor include $La_2O_2S:Eu$, $Y_2O_2S:Eu$ and $Gd_2O_2S:Eu$.

Examples of the rare earth aluminate phosphor that is mainly activated by lanthanoid elements such as Ce include YAG based phosphor represented by the formulas: $Y_3Al_5O_{12}:Ce$, $(Y_{0.8}Gd_{0.2})_3Al_5O_{12}:Ce$, $Y_3(Al_{0.8}Ga_{0.2})_5O_{12}:Ce$, and $(Y,Gd)_3(Al,Ga)_5O_{12}$. The examples also include $Tb_3Al_5O_{12}:Ce$ and $Lu_3Al_5O_{12}:Ce$ in which a portion or all of Y is substituted with Tb or Lu.

Examples of the alkaline earth metal silicate phosphor include silicates represented by the formula: $(SrBa)_2SiO_4:Eu$.

Examples of other phosphors include $ZnS:Eu$, $Zn_2GeO_4:Mn$, and $MGa_2S_4:Eu$ (wherein M represents at least one element selected from the group consisting of Sr, Ca, Ba, Mg and Zn).

If necessary, the phosphors described above can contain at least one element selected from the group consisting of Tb, Cu, Ag, Au, Cr, Nd, Dy, Co, Ni and Ti, in place of Eu, or in addition to Eu.

As stated, the above are just examples of the phosphors that can make up the phosphor layer 340. The transparent resin 342 of the phosphor layer may be of any resin material in which the phosphors 344 can be dispersed and remain stable. Examples of the first transparent resin 342 include epoxy resin, silicon resin, hard silicon resin, modified silicon resin, urethane resin, oxetane resin, acryl resin, polycarbonate resin, and polyimide resin.

The transparent resin cover 350 has the shape of a lens so as to diffuse light generated by the light emitting component 1. The curvature of the transparent resin cover 350 thus provides the diffusion/extraction characteristics of the light emitting device 5. The transparent resin cover 350 also encloses the phosphor layer 340 and thereby protects the phosphors 344 from being damaged by moisture. To these ends, the transparent resin cover 350 may be made of epoxy resin, silicon resin, hard silicon resin, modified silicon resin, urethane resin, oxetane resin, acryl resin, polycarbonate resin, and polyimide resin.

Figure 7:
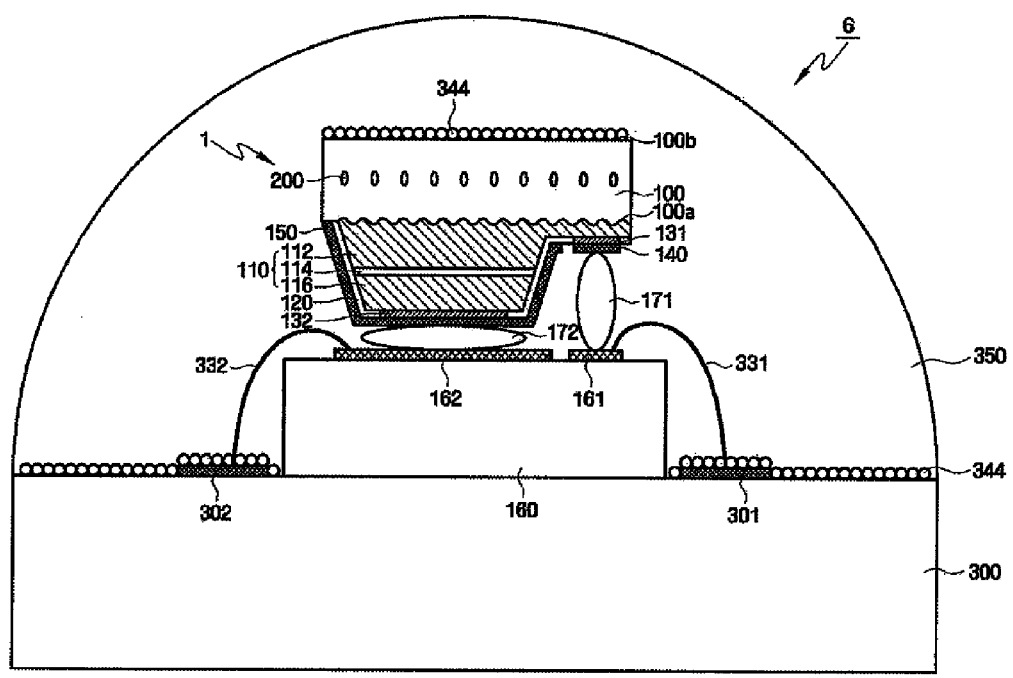
FIG. 7 is a cross-sectional view of a sixth embodiment of a light emitting device according to the inventive concept.

FIG. 7 shows a sixth embodiment of a light emitting device 6 according to the inventive concept.

Referring to FIG. 7, phosphors 344 are disposed along surfaces of the light emitting component 1 and the circuit board 300. More specifically, as shown in the figure, phosphors are disposed along the surface 100b of the substrate 100 of the light emitting component 1, and along the surface of the circuit board 300 on which the conductive regions 301 and 302 are provided (including over the conductive regions). The transparent resin cover 350 encapsulates the light emitting component 1.

Figure 8:
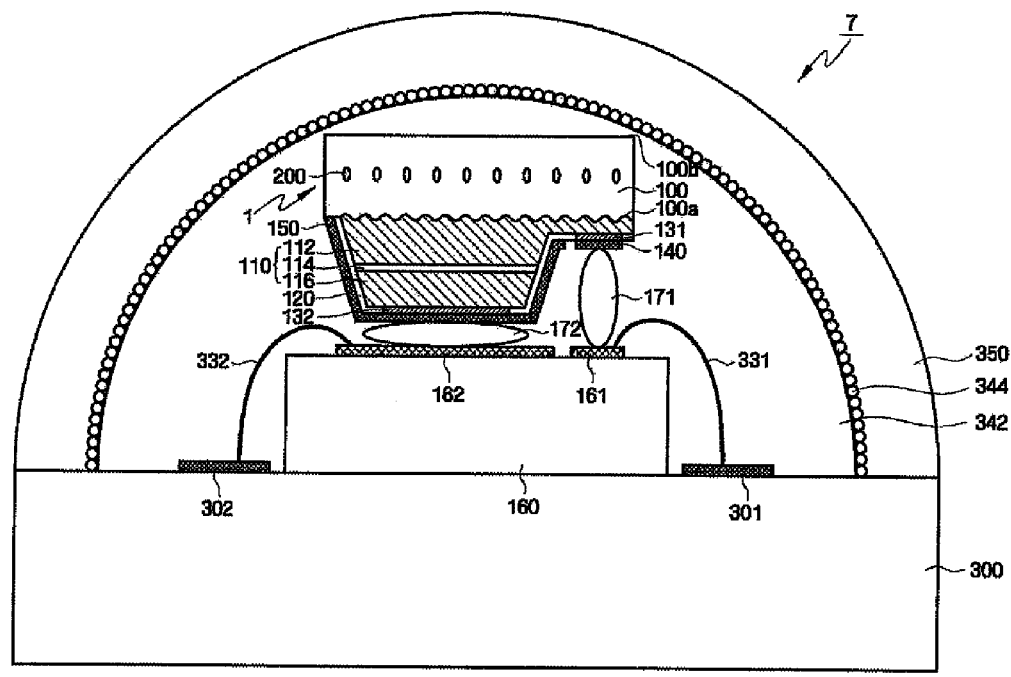
FIG. 8 is a cross-sectional view of a seventh embodiment of a light emitting device according to the inventive concept.

FIG. 8 shows a seventh embodiment of a light emitting device 7 according to the inventive concept.

Referring to FIG. 8, the light emitting device 7 includes a body of transparent resin 342 encapsulating the light emitting component 1, a layer of phosphors 344 extending along an outer surface of the body of transparent resin 342, and a cover or second body of transparent resin 350 extending over the layer of phosphors 344. That is, the phosphors 344 are not dispersed in the transparent resin 342 but rather are applied to the outer surface of the body of the transparent resin 342. Therefore, a thin layer of phosphors 344 can be formed around the light emitting component 1.

Figure 9:
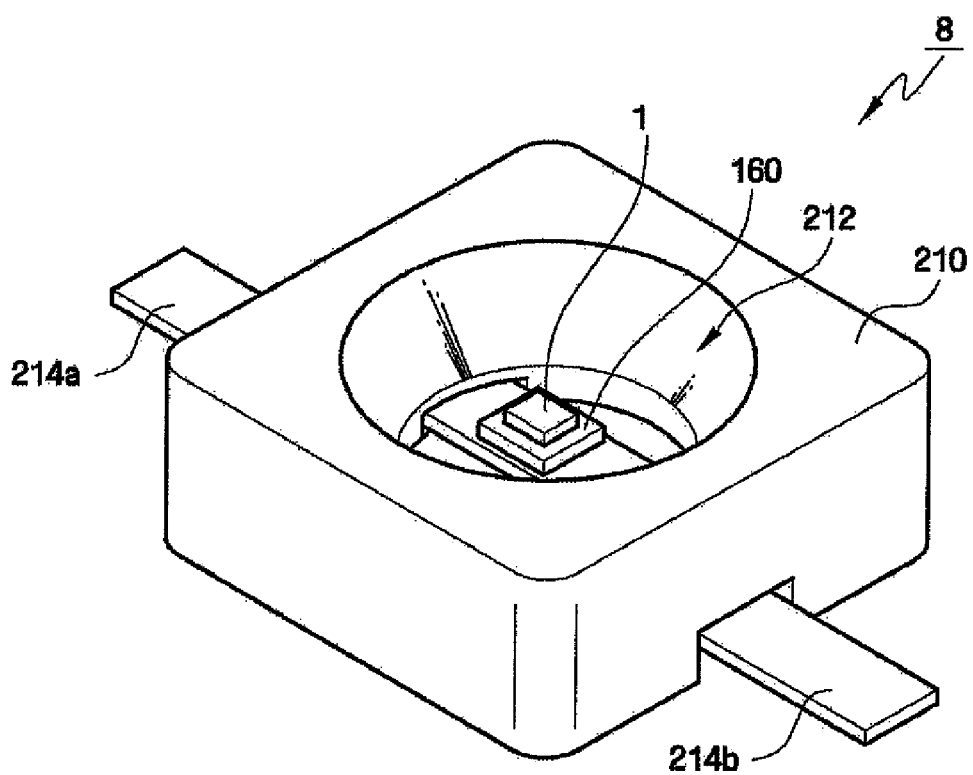
FIG. 9 is a perspective view of an eighth embodiment of a light emitting device according to the inventive concept.

FIG. 9 shows a ninth embodiment of a light emitting device 8 according to the inventive concept.

Referring to FIG. 9, the light emitting device 8 has the form of package and includes a light emitting component 1, a package body 210 to which the support substrate 160 of the light emitting component 1 is mounted, and leads 214a, 214b mounted to the package body 210 and connected to the light emitting component 1.

More specifically, the package body 210 has a recess 212 in which the support substrate 160 is disposed. Preferably, the recess 212 has oblique sides, e.g., the recess 212 has the shape of a frustum. Light generated by the light emitting component 1 is reflected from the inner surface of the package body 210 that defines the recess 212 and propagates out of the package body 210 through the top of the recess 212. Although not shown in FIG. 9, at least a portion of the recess 212 is filled with transparent resin. Phosphors may be mixed with the transparent resin or a layer of phosphors may be provided on an otherwise exposed surface of the body of resin.

The size and shape of the recess 212 is determined considering the amount of light to be reflected from the sides of the recess 212, the type of transparent resin if any disposed in the recess 212, and the type or types of phosphors if any disposed in or on the transparent resin. The support substrate 160 is also preferably disposed along the center axis of the recess 212 so that the light emitted from the package 8 has high chromaticity.

The package body 210 may be formed of an organic material having excellent lightfastness such as silicon resin, epoxy resin, acryl resin, urea resin, fluorine resin, or imide resin, or an inorganic material having excellent lightfastness such as glass or silica gel. Also, the package body 210 may be formed of a heat resistant resin to prevent the body from melting during the manufacturing process. Furthermore, the package body 210 may be formed of a mixture of resin and various fillers, such as aluminum nitride (MN), aluminum oxide ($Al_2O_3$), or a composite of AlN and $Al_2O_3$, that will serve to relieve thermal stress of the resin. Still further, a portion of the package body 210 or the entire package body 210 may be formed of metal or ceramics. For example, heat generated by the light emitting component 1 is readily dissipated in the case in which the entire package body 210 is made of metal.

The conductive regions of the support of the light emitting component 1 are electrically coupled to the leads 214a and 214b through vias in the support substrate 160. The leads 214a and 214b are preferably of a highly thermally conductive material so that heat generated by the light emitting component 1 can be dissipated directly through the leads 214a and 214b.

Figure 10:
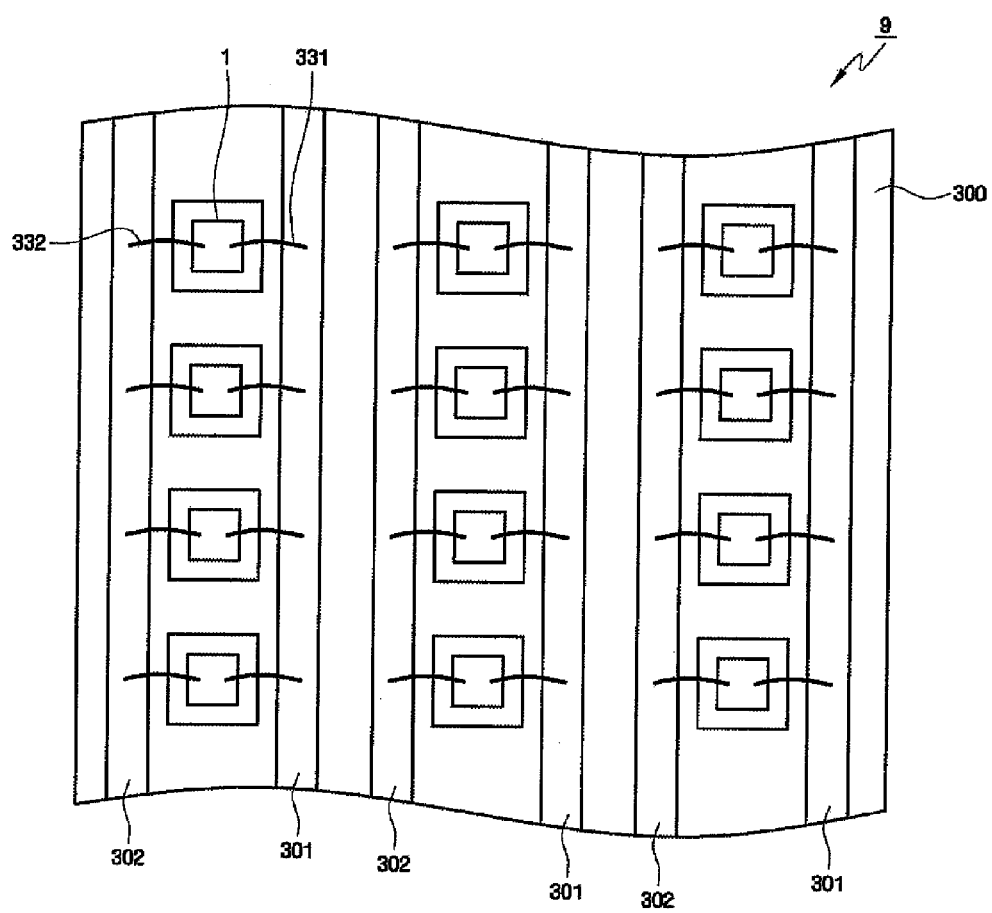
FIG. 10 is a plan view of an example of a ninth embodiment of a light emitting device having an array of light emitting components, according to the inventive concept.
Figure 11:
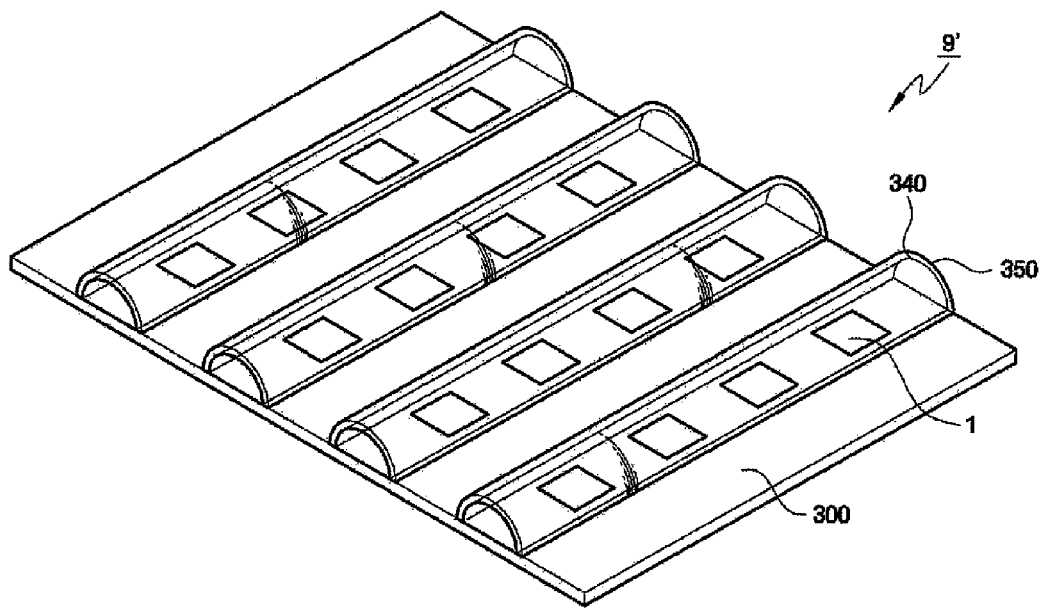
FIG. 11 is a perspective view of another example of a the light emitting device having an array of light emitting components, according to the inventive concept.
Figure 12:
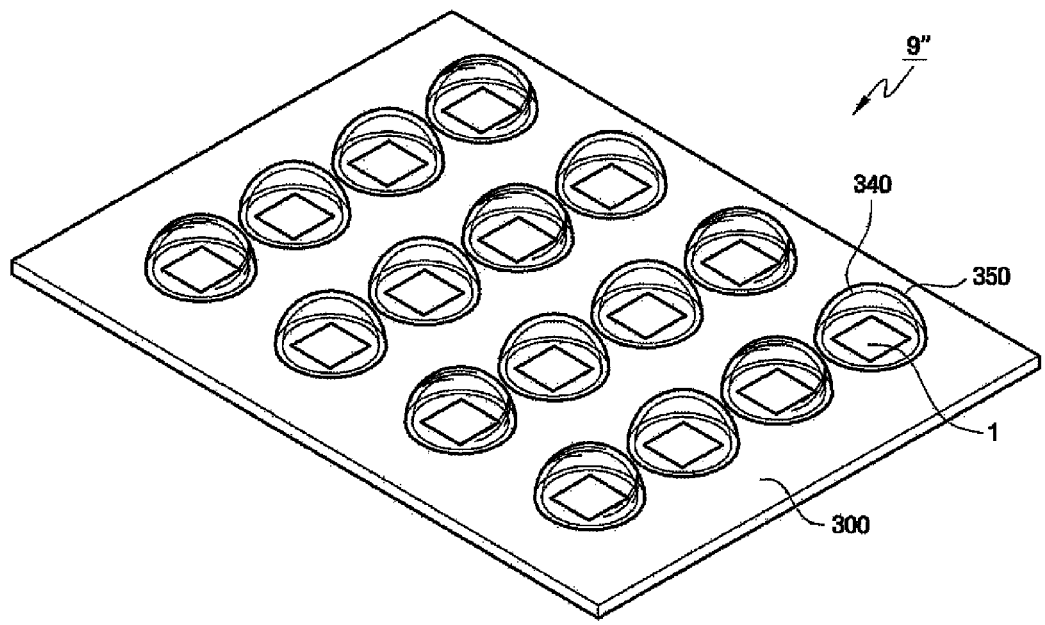
FIG. 12 is a perspective view of still another example of a light emitting device having an array of light emitting components, according to the inventive concept.

FIGS. 10 through 12 show different forms of a ninth embodiment of a light emitting device 9, 9' or 9" according to the inventive concept. Basically, the ninth of embodiment of a light emitting device 9, 9' or 9" of FIGS. 10 through 12 according to the inventive concept includes an array of light emitting components 1 on a circuit board 300. The examples of the light emitting devices 9' and 9" of FIGS. 11 and 12 each additionally includes phosphor layers 340, and transparent resin covers 350 on the light emitting components 1.

Referring to FIG. 10, the circuit board 300 has first and second conductive regions 301 and 302 extending parallel to each other in one direction. Respective ones of the light emitting components 1 are aligned in the direction in which the conductive regions 301 and 302 extend. The first electrode 140 of each light emitting component 1 is coupled to the first conductive region 301 via a wire 331 whereas the second electrode 150 is coupled to the second conductive region 302 via a wire 332. FIG. 10 shows three such sets of first and second conductive regions 301 and 302 and light emitting components 1 spaced from each other in a second direction perpendicular to the first direction.

When an appropriate bias is applied to the first and second conductive regions 301 and 302, the light emitting structures of the light emitting components 1 are forward biased and thus, emit light.

Referring to FIG. 11, the light emitting device 9' according to the inventive concept has a phosphor layer 340 and a transparent resin cover 350 disposed over a line of light emitting components 1. The phosphor layer 340 and the transparent resin cover 350 also enclose the entire first and second conductive regions 301 and 302 (refer to FIG. 10) to which the line of light emitting components 1 are electrically coupled. In the example shown in FIG. 11, the phosphor layer 340 and the transparent resin cover 350 are elongated in the (first) direction in which the light emitting components 1 are spaced along a line, and four such lines of light emitting components 1 covered by a respective phosphor layer 340 and a transparent resin cover 350 are spaced from each other in a second direction perpendicular to the first direction.

Referring to FIG. 12, the light emitting device 9' has a respective phosphor layer 340 and transparent resin cover 350 is disposed over each of the light emitting components 1.

Figure 13:
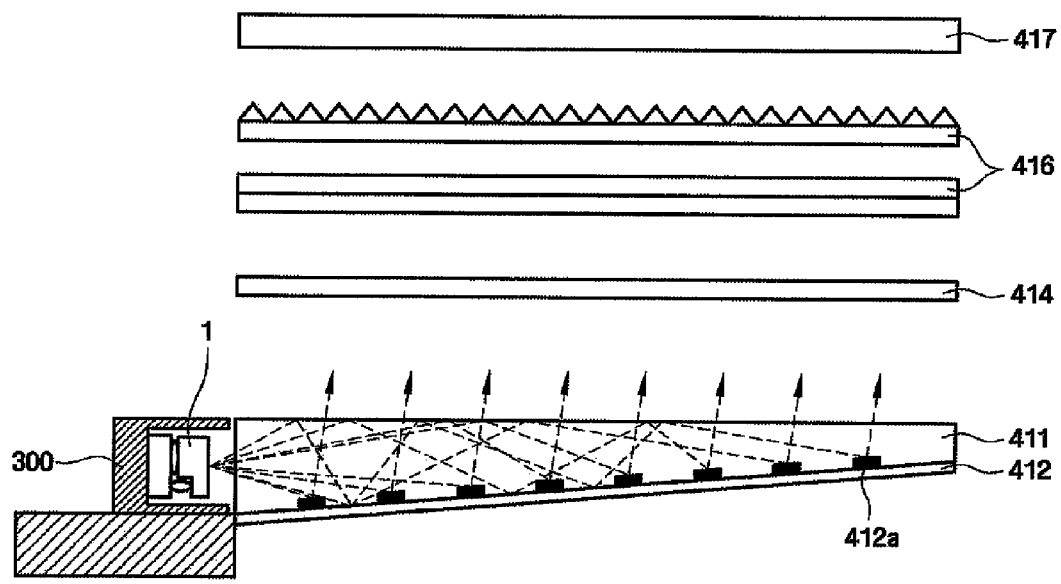
FIG. 13 is a schematic diagram of an LCD having a backlighting unit including a light emitting component, according to the inventive concept.

FIG. 13 shows a tenth embodiment of a light emitting device according to the inventive concept.

The light emitting device shown in FIG. 13 has various applications such as the light source of an illumination system, display, or mobile device such as a mobile phone, MP3 player, or navigation system. The light emitting device of FIG. 13 may be, for example, an edge-type of back lighting unit (BLU) for illuminating an LCD panel from the back in a liquid crystal display (LCD).

Referring to FIG. 13, the BLU includes a light emitting component 1, a light guide plate 411, a reflection sheet 412, a diffusion sheet 414, and a pair of prism sheets 416 juxtaposed with one another and with the diffusion sheet 414, light guide plate 411 and reflection sheet 412.

The light guide plate 411 is a panel made of a transparent plastic material, such as acryl, and directs light that is provided by the light emitting component 1 towards an LCD panel 417. To this end, the light guide plate 411 has a pattern 412a of reflective features printed on a bottom surface thereof so as to reflect light that is incident on such features toward the LCD panel 417.

The reflection sheet 412 is disposed on the bottom surface of the light guide plate 411 and reflects upward light propagating to the bottom surface of the light guide plate 411. That is, the reflection sheet 412 reflects the light that is not incident on the pattern 412a of reflective features back toward the top surface of the light guide plate 411. Although this structure is not particularly advantageous in terms of minimizing loss it nonetheless produces a high degree of uniformity in the light exiting from the top surface of the light guide plate 411.

The diffusion sheet 414 disperses light that has exited from the light guide plate 411, thereby preventing the light from concentrating at spots on the LCD panel 417.

Each of the prism sheets 416 has a plurality of triangular prisms periodically arranged on a top surface thereof. In the embodiment of FIG. 13, the prisms of one prism sheet 416 (the upper sheet in the figure) are arrayed in a first direction, and the prisms of the other prism sheet are arrayed in a second direction perpendicular to the first direction (perpendicular the plane of the figure). Furthermore, each of the prism sheets 416 may include two juxtaposed sets of triangular prisms, with the prisms of one set staggered relative to the prisms of the other set so that light diffused by the diffusion sheet 414 propagates perpendicular to the LCD panel 417.

Figure 14:
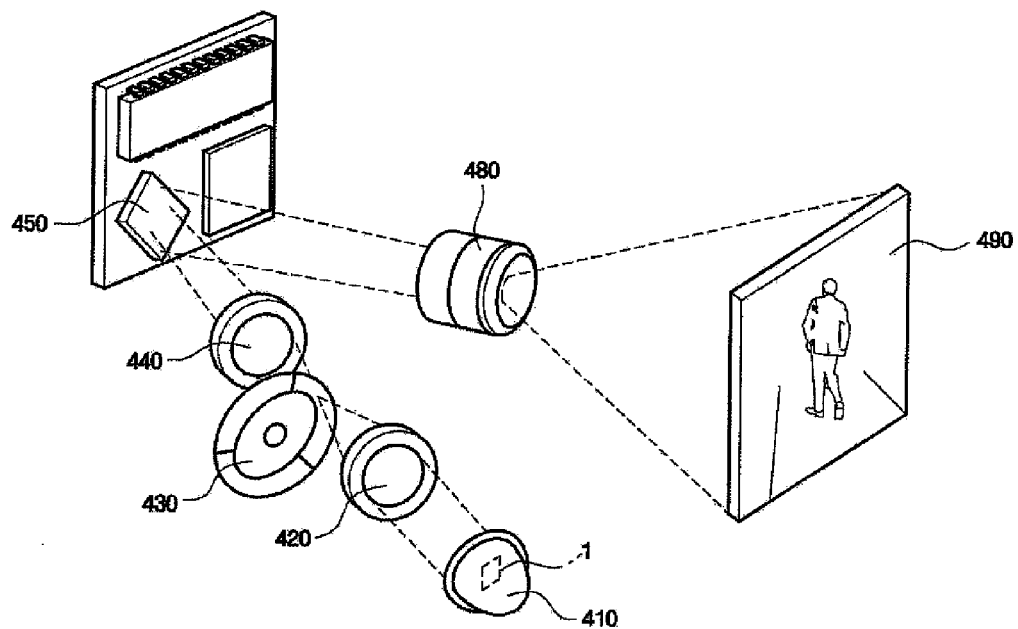
FIG. 14 is a perspective view of a projector having a light emitting component, according to the inventive concept.
Figure 15:
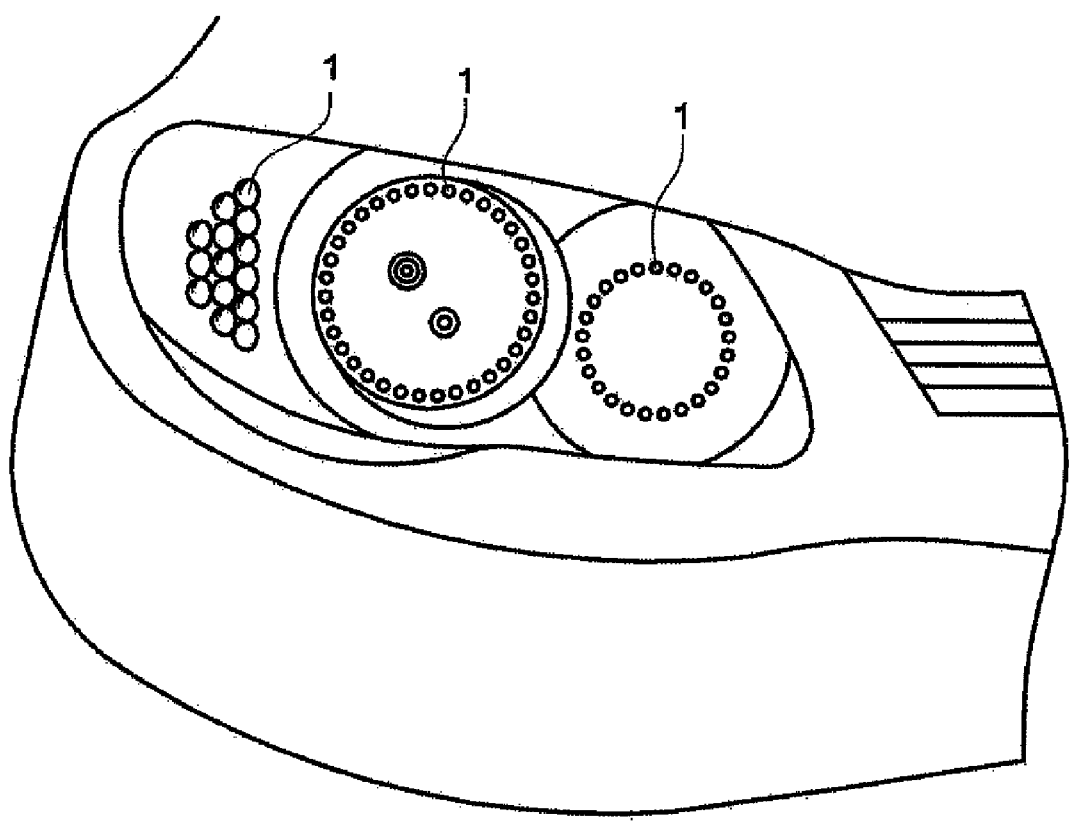
FIG. 15 is a front view of an automotive headlight having an array of light emitting components, according to the inventive concept.
Figure 16:
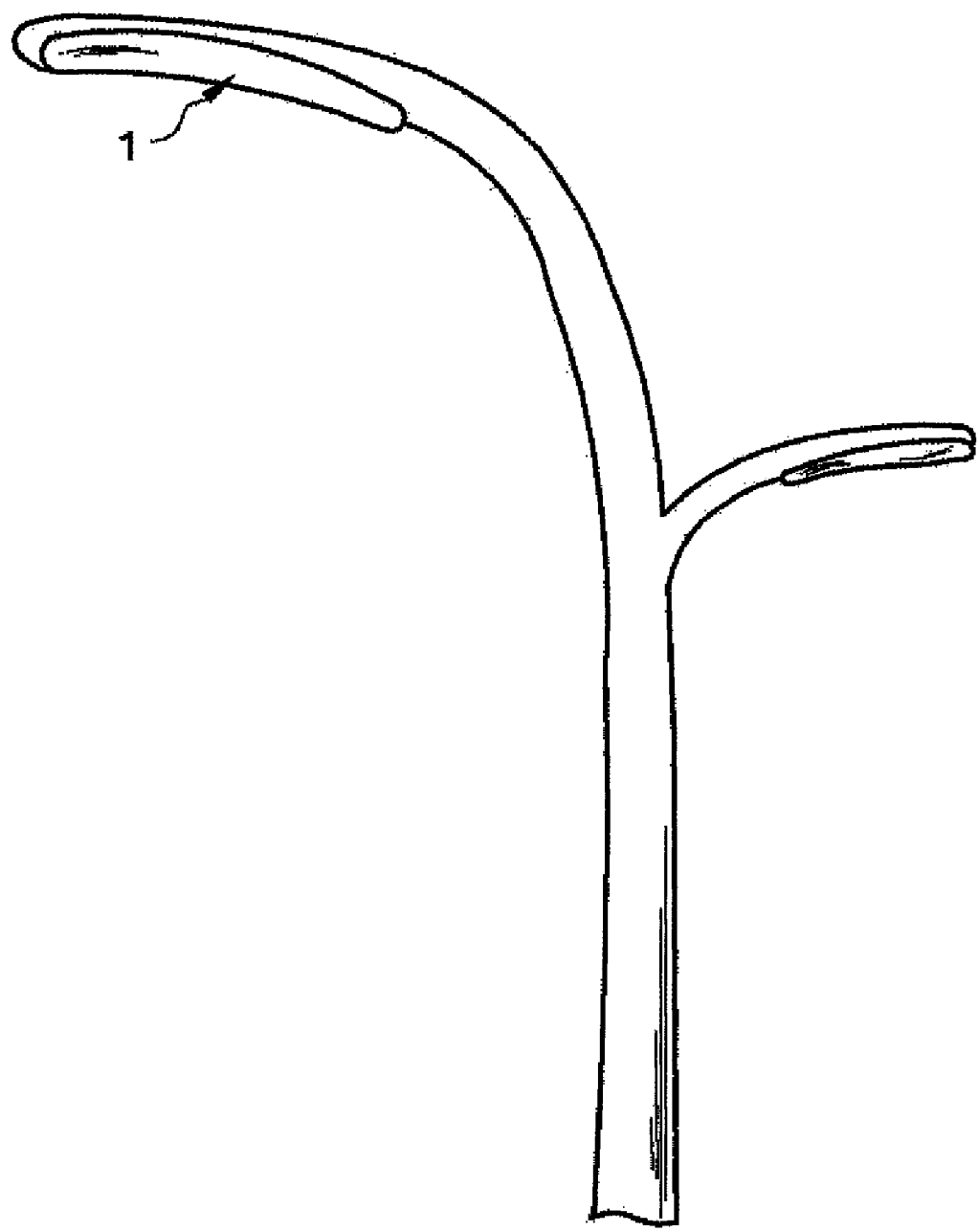
FIG. 16 is a perspective view of a streetlight having light emitting components, according to the inventive concept.
Figure 17:
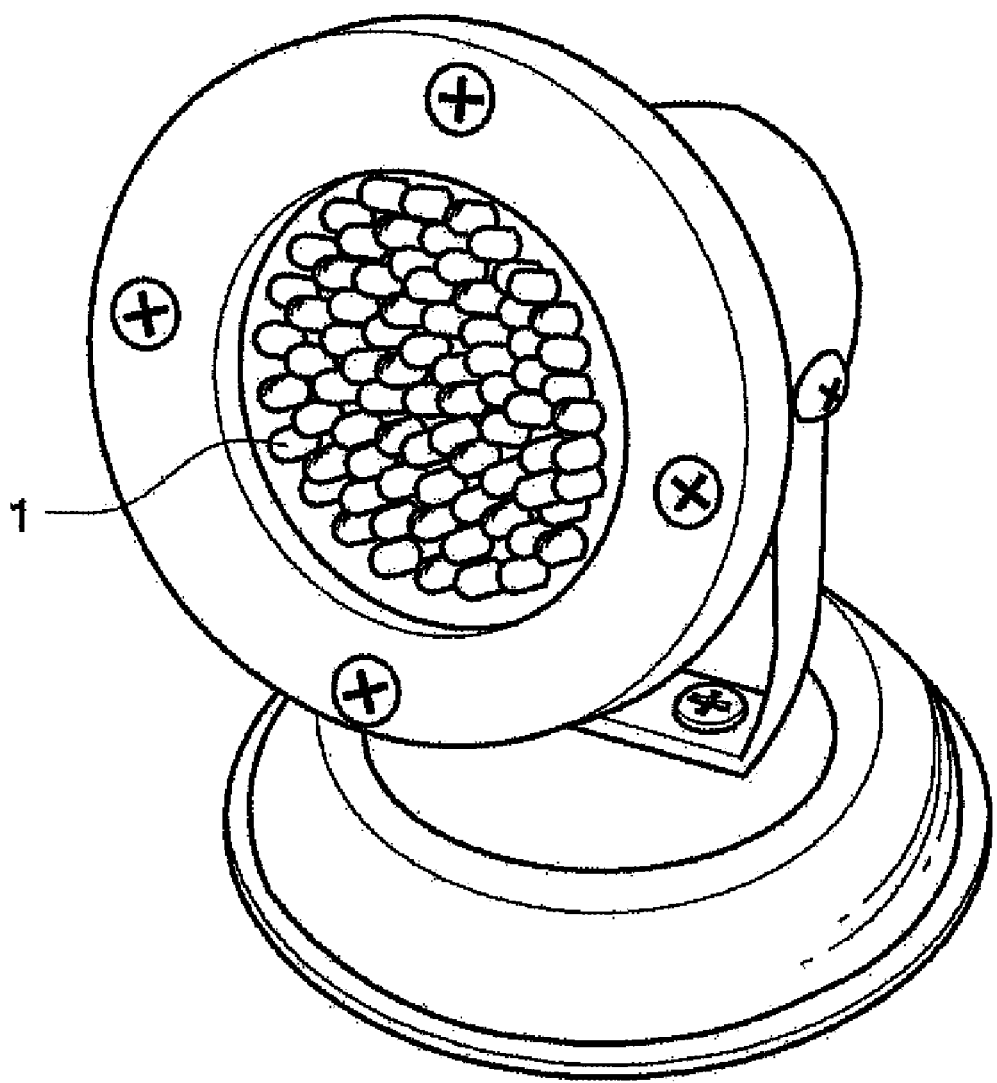
FIG. 17 is a perspective view of a lamp having an array of light emitting components, according to the inventive concept.

FIGS. 14 through 17 show other light emitting devices according to the inventive concept. More specifically, FIG. 14 illustrates a projector, FIG. 15 illustrates a car headlight, FIG. 16 illustrates a street light, and FIG. 17 illustrates a lamp.

Referring to FIG. 14, the projector includes a light source 410 comprising a light emitting component 1, a condensing lens 420, a color filter 430, a shaping lens 440, and a digital micro-mirror device (DMD) disposed along an optical axis. The projector also includes a projection lens 480 that projects light from the DMD onto a screen 490.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A light emitting device that emits light, the device comprising:
   a substrate having first and second surfaces facing in opposite directions, and a reformed region intermediate the surfaces; and
   a light emitting structure, comprising a source of the light emitted by the light emitting device, disposed on one of the surfaces of the substrate,
   wherein the index of refraction of the reformed region of the substrate is different from that of the remainder of the substrate, and the ratio d/t of a distance d between the other of the surfaces of the substrate and the reformed region to a thickness t of the substrate between the first and second surfaces is in a range of between 1/8 and 9/11, and
   wherein the reformed region comprises dots of polycrystalline and the remainder of the substrate is mono-crystalline.

2. The light emitting device of claim 1, wherein the thickness t of the substrate is in a range of between 80 and 110 μm.

3. The light emitting device of claim 1, wherein the distance d is in a range of between 10 and 90 μm.

4. The light emitting device of claim 1, wherein the dots of polycrystalline are spaced from one another by a distance of 2 to 12 μm in a direction perpendicular to the direction of thickness t of the substrate.

5. The light emitting device of claim 1, wherein the dots of polycrystalline are substantially ellipsoid, and a diameter of each of the dots of polycrystalline, as taken along a major axis of each of the dots of polycrystalline, is in a range of 2 to 20 μm.

6. The light emitting device of claim 1, wherein the index of refraction of the reformed region is greater than or equal to the index of refraction of air and less than the index of refraction of the remainder of the substrate.

7. The light emitting device of claim 1, further comprising first and second electrodes, and wherein the light emitting structure includes a first conductive pattern having a conductivity type, a second conductive pattern having a conductivity type opposite to the conductivity type of the first conductive pattern, and a light emitting pattern interposed between the first and second conductive patterns, and the first and second electrodes are electrically coupled to the first and second conductive patterns, respectively.

8. A light emitting device comprising:
   a substrate having first and second surfaces facing in opposite directions, and wherein the substrate at a location intermediate the first and second surfaces comprises polycrystalline dots spaced from one another in a layer in a direction perpendicular to the direction of thickness t of the substrate, and the remainder of the substrate apart from the polycrystalline dots is mono-crystalline; and
   a light emitting structure, comprising a source of the light emitted by the light emitting device, disposed on one of the surfaces of the substrate, and
   wherein a distance d between the other of the surfaces of the substrate and the polycrystalline dots in said layer is in a range of 10 to 90 μm, and
   for each respective pair of the polycrystalline dots that are adjacent one another in said direction perpendicular to the direction of thickness t of the substrate, the polycrystalline dots are spaced from one another in said layer by a distance of 2 to 12 μm.

9. The light emitting device of claim 8, wherein the ratio d/t of the distance d between the other of the surfaces of the substrate and the polycrystalline dots in said layer to the thickness t of the substrate between the first and second surfaces is in a range of between 1/8 and 9/11.

* * * * *